United States Patent
Jiang et al.

(10) Patent No.: US 9,024,246 B2
(45) Date of Patent: May 5, 2015

(54) TWO-STATE NEGATIVE FEEDBACK AVALANCHE DIODE HAVING A CONTROL ELEMENT FOR DETERMINING LOAD STATE

(71) Applicant: Princeton Lightwave, Inc., Cranbury, NJ (US)

(72) Inventors: Xudong Jiang, Princeton, NJ (US); Mark Allen Itzler, Princeton, NJ (US); Ketan Mukund Patel, Rochester, NY (US)

(73) Assignee: Princeton Lightwave, Inc., Cranbury, NJ (US)

( * ) Notice: Subject to any disclaimer, the term of this patent is extended or adjusted under 35 U.S.C. 154(b) by 226 days.

(21) Appl. No.: 13/716,977

(22) Filed: Dec. 17, 2012

(65) Prior Publication Data

US 2014/0061443 A1  Mar. 6, 2014

Related U.S. Application Data

(60) Provisional application No. 61/577,227, filed on Dec. 19, 2011.

(51) Int. Cl.
*H01J 40/14* (2006.01)
*H03K 17/78* (2006.01)

(52) U.S. Cl.
CPC ...................................... *H03K 17/78* (2013.01)

(58) Field of Classification Search
CPC .... H03K 17/78; H03K 5/1252; H01L 31/107; H02M 3/156
USPC ............. 250/214 R, 214.1, 214 LA; 257/199, 257/186, 431; 327/513–515, 326
See application file for complete search history.

(56) References Cited

U.S. PATENT DOCUMENTS 8,901,475 B1 * 12/2014 Joffe et al. ................ 250/214 R

* cited by examiner

*Primary Examiner* — Que T Le
(74) *Attorney, Agent, or Firm* — Kaplan Breyer Schwarz & Ottesen, LLP

(57) ABSTRACT

A negative feedback avalanche diode for detecting the receipt of a single photon is described. The photodetector comprises a load element having two load states, one characterized by high impedance and the other characterized by low impedance. The load state of the load element is controlled by a control signal generated within the negative feedback avalanche diode itself.

16 Claims, 2 Drawing Sheets

US 9,024,246 B2

TWO-STATE NEGATIVE FEEDBACK AVALANCHE DIODE HAVING A CONTROL ELEMENT FOR DETERMINING LOAD STATE

CROSS-REFERENCE TO RELATED APPLICATION

This application claims the benefit of U.S. provisional application Ser. No. 61/577,227, filed 19 Dec. 2011, entitled "Two-state Negative Feedback Avalanche Diode," which is incorporated by reference.

STATEMENT REGARDING FEDERALLY SPONSORED RESEARCH

This invention was made with Government support under W31P4Q10C0164 awarded by the Defense Advanced Research Projects Agency (DARPA). The Government has certain rights in the invention.

FIELD OF THE INVENTION

The present invention relates to avalanche photodetectors in general, and, more particularly, to single-photon avalanche photodetectors.

BACKGROUND OF THE INVENTION

Photodetectors capable of detecting a single photon (i.e., a single "particle" of optical energy) are useful in many applications. To date, most of these applications have relied on the use of single-photon detectors such as photomultiplier tubes (PMTs) or single-photon avalanche detectors (SPADs) that are silicon-based, and are therefore capable of efficiently detecting only photons that have a wavelength within the range of approximately 250 nanometers (nm) to approximately 900 nm. New applications are emerging, however, that require single-photon detectors that can operate at high speed (>1 MHz) and at longer wavelengths (>1000 nm). Such devices would find use in areas such as: quantum information processing, quantum computing, quantum cryptography, and quantum teleportation and communications; low-light-level imaging and other high-performance imaging applications; and others. Unfortunately, currently available SPADs do not have the combination of high operational speed and wavelength range required for many of these applications.

An avalanche photodiode (APD) is a type of photodetector that is capable of providing extremely high sensitivity. An APD derives its name from the manner in which its output signal is created. When an APD absorbs photons, their energy excites electrons normally bound in the atomic lattice of the APD material to create free electrons. Each freed electron leaves behind a positively charged vacancy (i.e., a "hole") in the crystal structure. These electrons and holes are free-charge carriers that can flow freely through the structure of the APD.

In the presence of an electric field (due to a bias voltage applied across the APD), these free-charge carriers are accelerated through a region of the avalanche photodiode known as the "multiplication region." As the free-charge carriers travel through the multiplication region, they collide with other electrons and holes bound in the atomic lattice, thereby generating more free-charge carriers through a process called "impact ionization." These new free-charge carriers also become accelerated by the applied electric field and generate yet more free-charge carriers.

When operated in "Geiger mode," an APD can be made sensitive enough to detect even a single photon, and a device designed specifically for this purpose is referred to as a single-photon avalanche diode (SPAD). In Geiger-mode operation, a SPAD is "armed" by biasing it with a voltage that is above its breakdown voltage, which is the voltage bias level above which free-charge carrier generation can become self-sustaining and result in a run-away avalanche. Arming a SPAD puts it in a meta-stable state in which absorption of a single photon can give rise to a runaway avalanche that results in an easily detectable macroscopic current. This avalanche event can occur very rapidly and efficiently and it is possible to generate several hundred million free-carriers from a single absorbed photon in less than one nanosecond (ns).

In order to prepare the SPAD for re-arming once this current is generated, the avalanche current must be halted. This is done with a process referred to as "quenching," wherein the bias voltage is reduced to a value sufficiently close to the breakdown voltage that the avalanche can spontaneously terminate.

Controlling voltage bias to arm and quench an APD is one of the primary challenges for Geiger-mode operation and the rate at which a single-photon detector can be operated is determined by (1) how quickly the APD can be quenched once a photon has been detected and (2) how quickly the APD can be re-armed once it has been quenched.

Although quenching stops the avalanche process, not all free carriers are instantaneously swept out of the avalanche region. Instead, some carriers become trapped in the multiplication region in trap energy states, which arise from crystalline defects or other causes. These trapped carriers are released in a temporally random manner based on such factors as temperature, the type of trap state, and the applied bias voltage. When a trapped carrier is released after the SPAD has already been re-armed, there is a possibility that it can initiate impact ionization as if the APD has absorbed a photon. As a result, the detrapping of a carrier can result in a "false" electrical signal that occurs in the absence of photon absorption. A false count that occurs in the absence of a photon absorption is referred to as a "dark count," and dark counts that arise specifically from detrapping of trapped carriers are referred to as "afterpulses."

The temporal variation in the rate of dark counts constitutes noise in a single-photon avalanche detector. As a result, afterpulses degrade SPAD sensitivity. One approach for improving sensitivity in the presence of afterpulsing is to simply delay rearming after quenching. This allows trapped charges a sufficient period of time to detrap while the SPAD remains unarmed. Unfortunately, such an approach requires an undesirably long period of time when the single-photon detector is insensitive to incident photons.

Alternative approaches for reducing afterpulse effects include 1) actively inducing rapid detrapping of trapped charges; 2) stifling the detrapping of trapped charges; and 3) limiting the number of free carriers that flow through the multiplication region during an avalanche event.

Actively induced detrapping can be accomplished in several different ways, such as heating the photodiode or energizing the carriers by illuminating them with light at a different wavelength. Such approaches, however, have shown very limited success. Elevating the temperature of an APD imposes a severe tradeoff by increasing the dark count rate while sub-bandgap illumination has not yet been shown to effectively induce carrier detrapping. In addition, these approaches increase cost and complexity, making these approaches undesirable in many applications.

The stifling of trapped charges by lowering the temperature of a SPAD to "freeze" trapped charge carriers has not been successfully demonstrated. In fact, for practical SPAD devices, this approach is likely to increase after-pulsing as temperature is reduced. Further, if carrier freeze-out were successful, it is likely that at least some of the charge carriers associated with the dopant atoms would also be "frozen," thus rendering the SPAD inoperable.

Some afterpulse reduction has been successfully demonstrated through the use of external circuitry to limit the flow of free carriers through the multiplication region during an avalanche event. However, the capacitance associated with the external circuitry adds to the RC time constant that dictates the rate at which a SPAD can be rearmed after quenching. For high-speed operation (i.e., >1 MHz), this RC time constant must be less than about 1 microsecond. As a result, any capacitance associated with external electronics that adds to the capacitance of the SPAD itself is generally undesirable. Moreover, the use of external circuitry generally involves significant complexity, and it can lead to additional undesirable parasitic elements in addition to the capacitance just described.

Monolithic, passive quenching approaches for limiting the flow of free carriers by have also been explored. The use of a monolithically integrated quenching (or feedback) load element can help to avoid the excessive parasitic capacitance inherent in the use of external circuitry. However, this legacy "negative feedback avalanche diode" (NFAD) is limited by an inherent tradeoff: a large feedback load is desired to promote rapid quenching, but a small feedback load is necessary to enable rapid re-arming. In prior-art NFADs, a single feedback load value is chosen to balance this tradeoff between the timescales for quenching and re-arming and, therefore, overall device performance is necessarily compromised.

SUMMARY OF THE INVENTION

The present invention enables high-speed operation of single-photon detectors without some of the costs and limitations of the prior art. Embodiments of the present invention include an NFAD that comprises a SPAD coupled with a dual-state feedback system. The feedback system comprises a feedback element that has a first state during quenching and a second state during re-arming, wherein the first state has a large load and the second state has a small load. The state of the feedback element is controlled by an electrical signal that originates within the SPAD itself. Embodiments of the present invention are particularly well suited for use in single-photon detection applications requiring operation at rates greater than 10 MHz.

In operation, the feedback system enables strong quenching (i.e., provides a "large" load via the feedback element) during the SPAD avalanche until the quench is complete and then rapidly changes the state of the feedback element to enable fast recharging (i.e., provides a "small" load via the feedback element) to re-arm the device. As soon as re-arming is complete, the feedback element again assumes "large" load characteristics for the next avalanche to be quenched.

An illustrative embodiment of the present invention comprises a feedback system that includes a feedback element and a second "control" element, which is able to induce the change in the feedback element between large load and small load. The control element is operates via an electrical signal provided by the SPAD itself.

In some embodiments, the feedback element functions as a switch with a very high impedance state for quenching and low impedance state for recharging. In some embodiments, the feedback element comprises a transistor with appropriate ON/OFF state properties.

In some embodiments, the control element provides a temporal delay appropriate for delayed switching of the load between its two states.

An embodiment of the present invention comprises: an avalanche photodiode dimensioned and arranged to enable single-photon detection; a load element having a first load state and a second load state, the first load state being higher impedance than the second load state; and a control element; wherein the load element and control element collectively define a load for the avalanche photodiode, and wherein the load element switches between the first load state and second load state based on a control signal generated within the photodetector.

DETAILED DESCRIPTION

The following terms are defined for use in this Specification, including the appended claims:

Single-photon avalanche diode (SPAD) is defined as an avalanche photodiode structure designed and intended for operation in Geiger mode.

Negative feedback avalanche diode (NFAD) is defined as a SPAD that is operatively coupled with a negative feedback load. Preferably, the negative feedback load and SPAD are monolithically integrated.

Electrically connected is defined as being in direct electrical contact. Two terminals are considered electrically connected if each remains at the same voltage potential for substantially any magnitude of electrical current through them (neglecting any inadvertent voltage drop through a conductive electrical line or trace used to connect the terminals together).

Figures 1, 2:
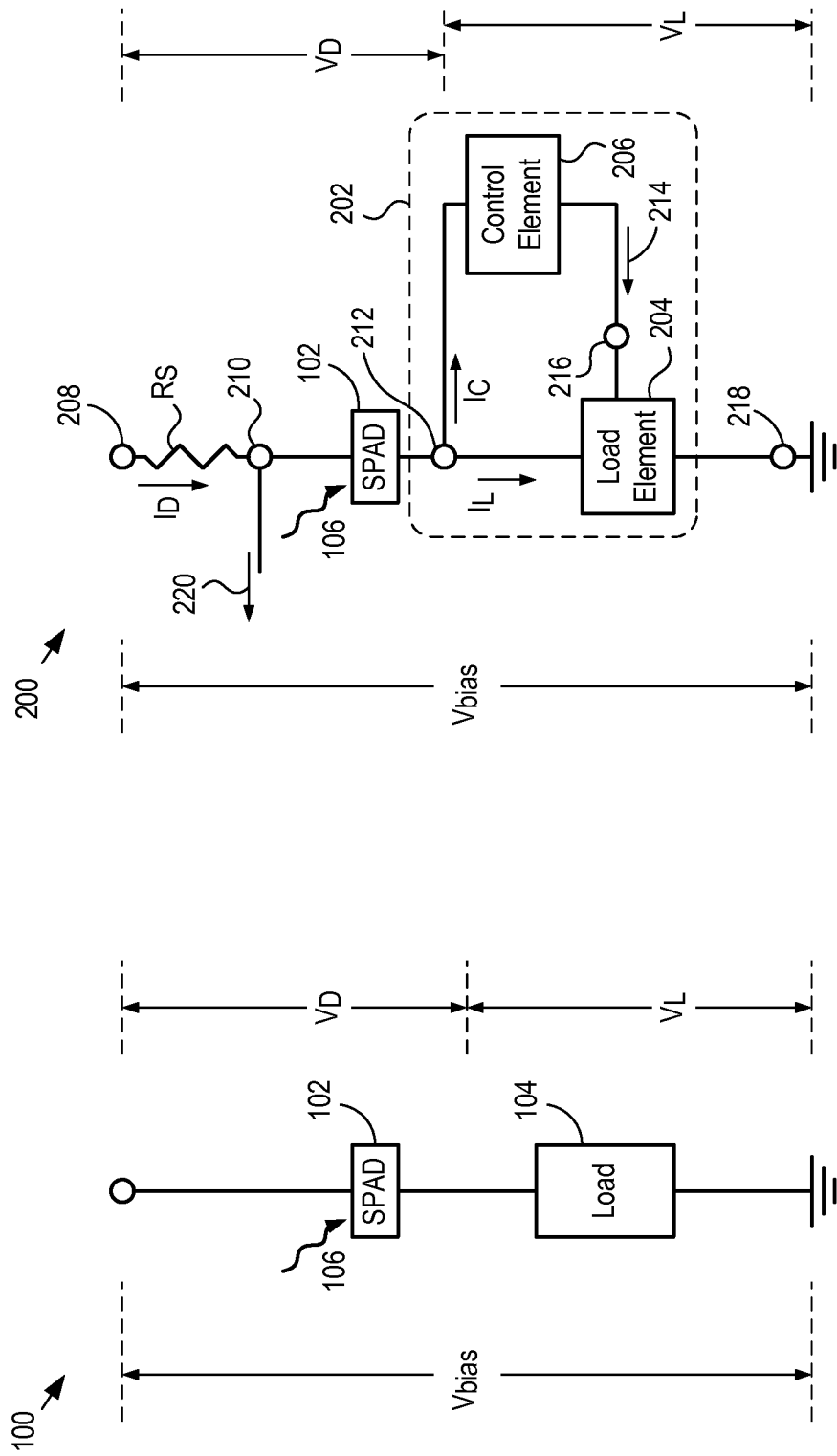
FIG. 1 depicts a schematic drawing of an NFAD in accordance with the prior art.
FIG. 2 depicts a schematic drawing of an NFAD in accordance with an illustrative embodiment of the present invention.

FIG. 1 depicts a schematic drawing of an NFAD in accordance with the prior art. NFAD 100 comprises SPAD 102 and load 104.

SPAD 102 is an avalanche photodiode that is dimensioned and arranged to provide a measurable output current in response to the receipt of photon 106, which has a wavelength within the wavelength range for which SPAD 102 is operable.

Load 104 is a conventional discrete resistor having a value within the range of approximately 10 KΩ approximately 10 MΩ. Load 104 is electrically connected with the anode of SPAD 102 to form a series combination of elements. In some cases, load 104 is a different load, such as one or more resistive and/or reactive linear elements, non-linear devices such as a transistor, and various combinations of these devices.

In operation, Vbias is applied across the series combination of SPAD 102 and load 104. Vbias is a voltage above the breakdown voltage, Vbr, of SPAD 102, as a result, Vbias "arms" the SPAD, which enables the SPAD to give rise to an electric current in response to the receipt of a single photon.

Prior to incidence of a photon on SPAD 102, no current flows through the series combination of SPAD 102 and load 104; therefore, the voltage drop across load 104, $V_L$, is substantially zero. Upon receipt of a photon, however, SPAD 102 avalanches giving rise to a macroscopic current flow through load 104 and voltage drop $V_L$ to increase. As a result, the voltage drop, $V_D$, across SPAD 102 reduces to a value very close to the breakdown voltage, thereby causing the avalanche to quench.

A principal shortcoming of the NFAD shown in FIG. 1 is that a load with sufficient impact to rapidly quench a SPAD avalanche typically requires a long recharge time for re-arming SPAD 102. To illustrate, consider that for an effective purely resistive load, a larger resistance would provide a more rapid quench. Unfortunately, it also would require a longer time for recharging the SPAD due to its associated large RC time constant, which is dictated by the product of the load resistance and the inherent capacitance of the SPAD 102.

FIG. 2 depicts a schematic drawing of an NFAD in accordance with an illustrative embodiment of the present invention. NFAD 200 comprises SPAD 102, load 202, and sense resistor $R_S$.

Sense resistor $R_S$ is a conventional resistor having resistance of approximately 50Ω and is typically integrated with SPAD 102 in hybrid fashion. Although in the illustrative embodiment sense resistor $R_S$ has a resistance of approximately 50Ω, it will be clear to one skilled in the art, after reading this Specification, how to specify, make, and use alternative embodiments of the present wherein sense resistor $R_S$ has a resistance that is other than 50Ω.

Load 202 includes load element 204 and control element 206. Collectively, load element 204 and control element 206 define a dual-state load for SPAD 102, wherein the impedance of the load is based on a control input that is obtained from the output of the SPAD itself. In the illustrative embodiment, load 202 and SPAD 102 are monolithically integrated; however, in some embodiments, load 202 and SPAD 102 are different elements that are integrated in another manner that yields a highly integrated system. Integration methods suitable for use with the present invention include, without limitation, flip-chip bonding, plasma-assisted bonding, wafer bonding, die bonding, and the like.

Figure 3:
FIG. 3 depicts operations of a method for operating NFAD 200 in high-frequency Geiger mode in accordance with the illustrative embodiment of the present invention.

FIG. 3 depicts operations of a method for operating NFAD 200 in high-frequency Geiger mode in accordance with the illustrative embodiment of the present invention. Method 300 begins with operation 301, wherein NFAD 200 is armed by providing $V_{bias}$ between terminals 208 and 218 (i.e., across the series combination of sense resistor $R_S$, SPAD 102, and load 204), where $V_{bias}$ is greater than the breakdown voltage, Vbr, of SPAD 102. In the absence of an incident photon, substantially no current flows through SPAD 102; therefore, there is an insignificant voltage drop across each of load 202 and sense resistor $R_S$; therefore, almost all of $V_{bias}$ develops across SPAD 102. In other words, prior to the receipt of a photon, $V_D$ is substantially equal to $V_{bias}$, and develops between terminals 210 and 212.

At operation 302, SPAD 102 absorbs photon 106. Photon 106 is a single photon having a wavelength greater than 1000 nm. Because SPAD 102 is biased above its breakdown voltage, receipt of this single photon results in an avalanche event that gives rise to macroscopic current $I_D$, which flows through the series combination of SPAD 102 and load 202. Although in the illustrative embodiment, SPAD 102 is operable to detect a photon having a wavelength that is greater than 1000 nm, it will be clear to one skilled in the art, after reading this Specification, how to specify, make, and use a SPAD that is operable for detecting photons having wavelengths other than just those greater than 1000 nm.

At operation 303, output signal 220 is provided at terminal 210. Output signal 220 is the voltage drop that arises from the flow of $I_D$ through sense resistor $R_S$.

At terminal 212, current $I_D$ is divided into current $I_L$, which flows through load element 204, and current $I_C$, which flows through control element 206.

Load element 204 is a field-effect transistor that has two distinct impedance states between terminals 212 and 218, which are electrically connected with the source and drain of the transistor. The impedance state of load element 204 depends upon control signal 214, which is provided to load element 204 at terminal 216, which is electrically connected to the gate of the transistor. In the absence of a suitable control input at terminal 216, load element 204 has a very high impedance state between terminals 212 and 218. When a suitable control signal is applied to terminal 216, however, load element 204 has a low impedance state between terminals 212 and 218. In some embodiments, load element 204 is an element, other than a field-effect transistor, having an impedance that can be alternated between high impedance and low impedance based on the application of a control signal. Load elements suitable for use with the present invention include, without limitation, CMOS transistors, NMOS transistors, bipolar-junction transistors, and the like.

At the onset of operation 303, the magnitude of control signal 214 is substantially zero. As a result, there is no voltage applied to the gate of the transistor and load element 204 is in a high impedance state. The flow of current $I_L$ through load element 204, therefore, quickly gives rise to a large voltage drop, $V_L$.

At operation 304, voltage drop $V_L$ reduces the magnitude of the voltage drop across SPAD 102 to a magnitude sufficiently close to its breakdown voltage, Vbr, to quench the avalanche event caused by the receipt of photon 106. Preferably, quenching of NFAD 200 occurs within approximately 1 ns from the receipt of photon 106.

At operation 305, current $I_C$ flows through control element 206.

Control element 206 is a resistive circuit element having a resistance suitable for quickly developing a suitable voltage drop between terminals 212 and 216 in response to the flow of current $I_C$, which results in an increase in the magnitude of control signal 214 sufficient to induce load element 204 to toggle into its low impedance state.

Although in the illustrative embodiment control element 206 comprises a resistive circuit element, it will be clear to one skilled in the art, after reading this Specification, how to specify, make, and use alternative embodiments of the present invention wherein control element 206 comprises a reactive circuit element or an active circuit element. Reactive circuit elements suitable for use in control element 206 include, without limitation, capacitors, inductors, and the like. Active circuit elements suitable for use in control element 206 include, without limitation, CMOS transistors, NMOS transistors, bipolar transistors, and the like.

At operation 306, SPAD 102 charges at a rate determined by the charging time constant (i.e., RC time constant) of SPAD 200. Once the charge on SPAD 102 results in $V_D$ exceeding Vbr, NFAD 200 is re-armed and ready to detect the arrival of another photon. One skilled in the art will recognize that the RC time constant of NFAD 200 is substantially defined by the capacitance, C, of SPAD 102 and the resistance, R, of load 202. When load element 204 is in its low-impedance state, therefore, NFAD 200 is quickly re-armed. Preferably, NFAD 200 re-arms within approximately 1 ns.

It is an aspect of the present invention that control signal 214 is generated internally to NFAD 200. By way of contrast, prior-art approaches for controlling the load on a SPAD have relied upon the use of externally generated signals for control, which requires complicated circuitry and complex control algorithms, or a single-state passive quenching element that requires a tradeoff between quenching time and re-arming time. As a result, the present invention enables high frequency SPAD operation with potentially lower cost and/or complexity relative to the use of external circuits, as well as higher performance operation relative to the use of single-state passive quench elements.

It should be noted that capacitance at terminal 216 (i.e., the gate capacitance) of load element 204 and the resistance of control element 206 also collectively define an RC time constant that acts as a delay to circumvent the simultaneity problems inherent in some non-linear single element configurations. The delay introduced by the control element 206 is sufficiently long to ensure that the load remains in its "quenching state" (i.e., high impedance) for a sufficient period of time to effectively quench an induced avalanche event before switching the load to its "recharging state" (i.e., low impedance). Ideally, this delay is as short as possible to avoid excess avalanche charge flow, which would lead to undesirably large afterpulsing in the NFAD. Preferably, the total time required to quench NFAD 200 is less than about 1 ns. In fact, if possible, this time is much less than 1 ns to enable even higher operation rates.

In similar fashion, the combination of load element 204 and control element 206 provides a second (i.e., re-arming) delay that ensures that the "recharging state" is maintained long enough for the recharging to be completed before the load is again switched back to its "quenching state". This re-arming delay is also preferably 1 ns or less. In some embodiments, however, although a longer re-arming delay compromises detector availability, it can be tolerated in order to allow more time for charge detrapping and, thus, improve afterpulsing in the NFAD. For some applications, embodiments of the present invention have re-arming delays in the range of approximately 1 ns to approximately 100 ns. Further, in some other applications, counting rates as low as 1 MHz can be tolerated as long as the NFAD provides extremely low afterpulsing (e.g., due to a very long effective hold-off time). In some embodiments of the present invention, therefore, the re-arming delay of NFAD 200 can be as long as 1 microsecond.

An embodiment of the present invention includes a negative feedback avalanche detector comprising: a single-photon avalanche diode; load element having a first load state and a second load state, the first load state being higher impedance than the second load state; and a control element operable for providing a control signal that determines the load state of the load element; wherein the load element and control element collectively define a load for the single-photon avalanche diode, and wherein the load element switches between the first load state and second load state based on a control signal generated within the negative feedback avalanche detector.

It is to be understood that the disclosure teaches just one example of the illustrative embodiment and that many variations of the invention can easily be devised by those skilled in the art after reading this disclosure and that the scope of the present invention is to be determined by the following claims.

What is claimed is:

1. A negative feedback avalanche detector comprising:
a single-photon avalanche diode;
a load element having a first load state and a second load state, the first load state being higher impedance than the second load state; and
a control element operable for providing a control signal that determines the load state of the load element;
wherein the load element and control element collectively define a load for the single-photon avalanche diode, and wherein the load element switches between the first load state and second load state based on a control signal generated within the negative feedback avalanche detector.

2. The negative feedback avalanche detector of claim 1 wherein the control signal is based on a signal provided by the single-photon avalanche photodiode.

3. The negative feedback avalanche detector of claim 2 wherein the control signal is based on a first current through the single-photon avalanche photodiode.

4. The negative feedback avalanche detector of claim 1 wherein the control element comprises a resistor, and wherein the control signal is based on a first current from the single-photon avalanche photodiode, the first current being a portion of the avalanche current, and wherein at least a portion of the first current passes through the resistor.

5. The negative feedback avalanche detector of claim 1 wherein the load element comprises a transistor.

6. The negative feedback avalanche detector of claim 1 wherein the single-photon avalanche photodiode, the load element, and the control element are monolithically integrated.

7. The negative feedback avalanche detector of claim 1 wherein the single-photon avalanche photodiode is dimensioned and arranged to detect a single photon having a wavelength equal to or greater than 1000 nm.

8. The negative feedback avalanche detector of claim 1 wherein the control element and the load element collectively define a delay element.

9. The negative feedback avalanche detector of claim 1 wherein the control element comprises at least one element selected from the group consisting of a resistor, a reactive element, and a transistor.

10. A method comprising:
generating a first current in response the receipt of a first photon at a negative feedback avalanche photodiode;
providing a first portion of the first current to a load element, wherein the load element has a first load state and a second load state, and wherein the first load state is higher impedance that the second load state, and further wherein the load state of the load element is based on a first control signal;
providing a second portion of the first current to a control element;
providing the first control signal from the control element, the first control signal being based on the second portion.

11. The method of claim 10 further comprising providing the control element and the load element such that the load element switches from the first load state to the second load state in response to an increase in the magnitude of the first current and the load element switches from the second load state to the first load state in response to a decrease in the magnitude of the first current.

12. The method of claim 11 wherein the control element and load element are provided such that (1) the load element switches from the first load state to the second load state after a first time delay after the increase in the magnitude of the first current and (2) the load element switches from the second load state to the first load state occurs after a second time delay after the decrease in the magnitude of the first current.

13. The method of claim 10 further comprising providing the load element such that the load element includes a transistor.

14. The method of claim 10 further comprising providing the control element such that it includes a resistor.

15. The method of claim 10 further comprising providing the control element such that it includes a reactive element.

16. The method of claim 10 further comprising providing the control element such that it includes an active element.

* * * * *